United States Patent
Koyo et al.

(10) Patent No.: US 9,188,705 B2
(45) Date of Patent: Nov. 17, 2015

(54) COVER GLASS FOR PHOTOELECTRIC CONVERSION DEVICES AND METHOD FOR PRODUCING THE SAME

(75) Inventors: Mizuho Koyo, Tokyo (JP); Toru Yamamoto, Tokyo (JP); Mitsuhiro Kawazu, Tokyo (JP); Masaatsu Kido, Tokyo (JP)

(73) Assignee: NIPPON SHEET GLASS COMPANY, LIMITED, Tokyo (JP)

( * ) Notice: Subject to any disclaimer, the term of this patent is extended or adjusted under 35 U.S.C. 154(b) by 483 days.

(21) Appl. No.: 13/513,972

(22) PCT Filed: Nov. 5, 2010

(86) PCT No.: PCT/JP2010/006515
§ 371 (c)(1),
(2), (4) Date: Jun. 5, 2012

(87) PCT Pub. No.: WO2011/070714
PCT Pub. Date: Jun. 16, 2011

(65) Prior Publication Data
US 2012/0244318 A1   Sep. 27, 2012

(30) Foreign Application Priority Data

Dec. 11, 2009   (JP) ................. 2009-281234

(51) Int. Cl.
| | |
|---|---|
| B32B 5/16 | (2006.01) |
| B05D 1/02 | (2006.01) |
| G02B 1/113 | (2015.01) |
| G02B 1/115 | (2015.01) |
| H01L 31/0216 | (2014.01) |

(52) U.S. Cl.
CPC ............... *G02B 1/113* (2013.01); *G02B 1/115* (2013.01); *H01L 31/02168* (2013.01); *Y02E 10/50* (2013.01); *Y10T 428/24421* (2015.01)

(58) Field of Classification Search
CPC .......... G02B 1/11; G02B 1/111; G02B 1/113; G02B 1/115; H01L 31/02168; Y10T 428/22421; Y10T 428/24335; Y10T 428/24364; Y10T 428/24372; Y10T 428/2438; Y10T 428/24388
USPC ................... 428/141, 142, 143, 149
See application file for complete search history.

(56) References Cited

U.S. PATENT DOCUMENTS

| | | | |
|---|---|---|---|
| 7,026,542 B2 | 4/2006 | Kageyama et al. | |
| 2006/0121190 A1* | 6/2006 | Tsujino et al. | ................ 427/226 |

FOREIGN PATENT DOCUMENTS

| | | |
|---|---|---|
| JP | 2000-216417 | 8/2000 |
| JP | 2002-047019 | 2/2002 |

(Continued)

OTHER PUBLICATIONS

Machine Translation to English for JP 2009-088503A. Apr. 23, 2009. Translation obtained on Aug. 12, 2014.*

*Primary Examiner* — Maria Veronica Ewald
*Assistant Examiner* — Nancy Johnson
(74) *Attorney, Agent, or Firm* — Hamre, Schumann, Mueller & Larson, P.C.

(57) ABSTRACT

In order to eliminate non-uniformity in the appearance of a cover glass for photoelectric conversion devices, the reflectance curve of the cover glass is extremely flattened. Provided is a cover glass for photoelectric conversion devices that includes a glass sheet having an uneven surface such as a figured glass, and a reflection-reducing film formed on the uneven surface. The reflection-reducing film includes silica fine particles and a binder for the silica fine particles. The silica fine particles are arranged in a single layer on the top portion of the uneven surface of the glass sheet, while the silica fine particles are arranged in stacks to a thickness equivalent to at least three layers on the bottom portion of the uneven surface. The uneven surface of the glass sheet has an average spacing Sm of at least 0.4 mm but not more than 2.5 mm and an arithmetic average roughness Ra of 0.5 µm to 5 µm. The cover glass has a reflectance of at least 1.5% but not more than 3% over the entire wavelength range of 380 nm to 780 nm for incident light from the side on which the reflection-reducing film is formed.

14 Claims, 5 Drawing Sheets

(56) References Cited

FOREIGN PATENT DOCUMENTS

| JP | 2003-075604 | 3/2003 |
|---|---|---|
| JP | 2003-243689 | 8/2003 |
| JP | 2003-322704 | 11/2003 |
| JP | 2007-121786 | 5/2007 |
| JP | 2009-088503 | 4/2009 |

* cited by examiner

COVER GLASS FOR PHOTOELECTRIC CONVERSION DEVICES AND METHOD FOR PRODUCING THE SAME

TECHNICAL FIELD

The present invention relates to a cover glass for photoelectric conversion devices. The cover glass is arranged on the light incident side of a photoelectric conversion device and transmits light to a photoelectric conversion layer in the conversion device while protecting the photoelectric conversion device.

BACKGROUND ART

In a so-called crystalline photoelectric conversion device, a cover glass is generally arranged on the light incident side. However, when the photoelectric conversion device is installed on the roof of a house, light reflected from the cover glass may cause annoyance to the neighborhood in some cases. Therefore, a cover glass having an uneven surface so as to disperse the reflected light is used in applications that require attention to the reflected light, such as those used on the roof of a house.

Since the shape of the surface roughness affects the quantity of light to be transmitted through the cover glass, there have been reported attempts to optimize the shape of the surface roughness of the cover glass for improving the photoelectric conversion efficiency. For example, JP 2003-243689 A (Patent Literature 1) discloses a cover glass having a surface formed with hemispherical recesses. In this cover glass, the shape and arrangement of the recesses are designed so as to increase the quantity of light to be transmitted through the cover glass during the day throughout the year. In the case of forming recesses for such a purpose, the depth of the recesses is set to be greater than in the case for the purpose of imparting only an antiglare function.

Meanwhile, in some cases, a reflection-reducing film may be formed on the surface of a transparent base in order to increase the light transmittance of the base represented by a glass sheet. Although the most commonly used reflection-reducing film is a dielectric film obtained, for example, by vacuum vapor deposition, sputtering, or chemical vapor deposition (CVD), a fine particle-containing film that contains fine particles such as silica fine particles also may be used in some cases as the reflection-reducing film. The fine particle-containing film can be formed by applying a coating solution containing fine particles onto a transparent base by a method such as dipping, flow coating, or spray coating.

JP 2007-121786 A (Patent Literature 2) discloses the formation of a fine particle-containing film as a reflection-reducing film, though it is formed not on the cover glass but on the surface of a glass substrate of a photoelectric conversion device of the so-called thin film type. However, for the glass substrate used in such a photoelectric conversion device of the thin film type, a float glass having smooth surfaces is employed, as has been disclosed in this publication.

CITATION LIST

Patent Literature

Patent Literature 1: JP 2003-243689 A
Patent Literature 2: JP 2007-121786 A

SUMMARY OF INVENTION

Technical Problem

As disclosed in Patent Literature 1, attempts to increase the quantity of light to be transmitted through a cover glass having an uneven surface have been made mainly by improving the shape the surface roughness. Therefore, the detail of the reflection-reducing film to be formed on the uneven surface of the cover glass has hardly been studied previously.

Studies made by the inventors have revealed that the formation of a reflection-reducing film on the surface of a cover glass having an uneven surface may sometimes cause significant deterioration in appearance due to uneven reflection. Such uneven reflection becomes particularly significant in the case of employing a film forming method, such as spray coating, in which a distribution easily occurs in the film thickness.

It is an object of the present invention to reduce non-uniformity in the appearance of a cover glass for photoelectric conversion devices that is provided with a glass sheet having an uneven surface and a reflection-reducing film formed on this surface.

Solution to Problem

The present invention provides a cover glass for photoelectric conversion devices that includes a glass sheet having an uneven surface. The cover glass further includes a reflection-reducing film formed on the uneven surface of the glass sheet. The reflection-reducing film includes silica fine particles and a binder for the silica fine particles. The silica fine particles are arranged in a single layer on the top portion of the uneven surface, while the silica fine particles are arranged in stacks to a thickness equivalent to at least three layers on the bottom portion of the uneven surface. The uneven surface of the glass sheet has an average spacing Sm of at least 0.4 mm but not more than 2.5 mm and an arithmetic average roughness Ra of 0.5 μm to 5 μm. The cover glass has a reflectance of at least 1.5% but not more than 3% over the entire wavelength range of 380 nm to 780 nm for incident light from the side on which the reflection-reducing film is formed.

Advantageous Effects of Invention

The reflection-reducing film basically serves to reduce the light reflectance by making use of the interference between the light reflected from the interface with a base and the light reflected from the interface with air, and exerts the maximum reflection reducing effect at a specific wavelength to be determined depending on the film thickness and the refractive index of the base and the film. In a cover glass for photoelectric conversion devices, this wavelength is generally set within a visible region or in the vicinity thereof. Therefore, a specific reflection color is made more likely to be visually recognized by forming such a reflection-reducing film. As a result, non-uniformity caused by a slight difference in film thickness becomes susceptible to recognition. In the cover glass according to the present invention, the reflectance curve is extremely flattened in the wavelength range of 380 nm to 780 nm that corresponds to the visible region by using a glass sheet with a comparatively large roughness period and forming a reflection-reducing film so that the number of stacked layers of silica fine particles should be different between on the top portion and on the bottom portion of the uneven surface. Thus, the non-uniformity in the appearance of the cover glass is made less likely to be visually recognized.

DESCRIPTION OF EMBODIMENTS

Figure 1:
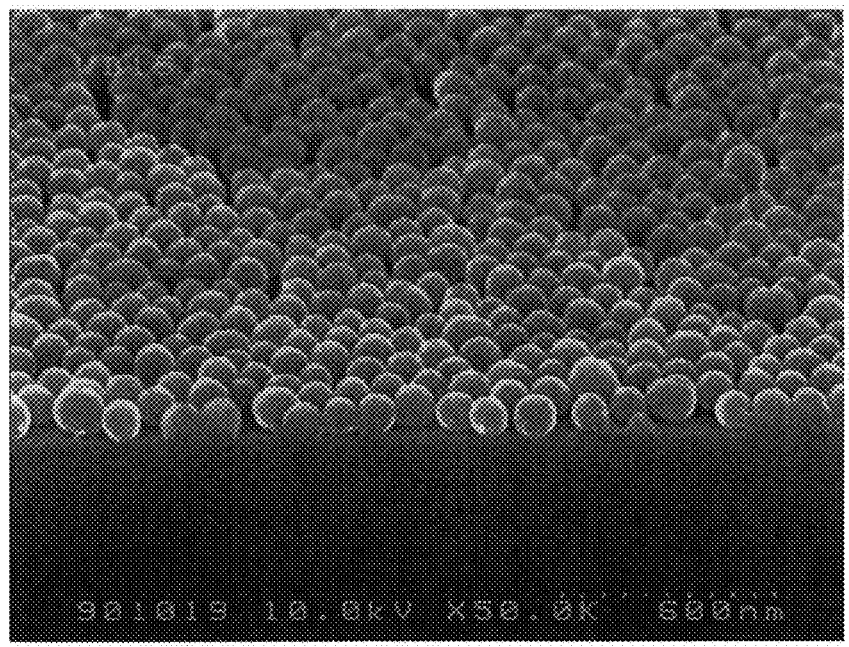
FIG. 1 is a view showing a result of observing a top portion of an uneven surface of a cover glass obtained in Example 1 using a Field Emission Scanning Electron Microscope (FE-SEM).

The cover glass for photoelectric conversion devices according to the present invention is provided with a glass sheet having an uneven surface, and a reflection-reducing film formed on the uneven surface of the glass sheet. The average spacing Sm of the uneven surface of the glass sheet is at least 0.1 mm but not more than 5.0 mm. The average spacing Sm is preferably at least 0.2 mm, particularly at least 0.4 mm, especially at least 1.0 mm, and is preferably 3.0 mm or less, further 2.5 mm or less, particularly 2.1 mm or less, especially 2.0 mm or less. The average spacing Sm is particularly preferably at least 0.5 mm but not more than 1.5 mm. Here, the average spacing Sm means an average spacing of each peak-to-valley period determined from the intersections of a roughness curve with an average line, which specifically is a value obtained according to JIS (Japan industrial standard) B0601-1994. Excessively small average spacing Sm averages the effects exerted by the uneven surface on the optical beam having a wavelength in the vicinity of the visible region, which therefore results in a failure to sufficiently flatten the reflectance curve. On the other hand, excessively large average spacing Sm causes color unevenness in the reflection color tone to appear in a plane, which thus results in a failure to satisfy appearance requirements.

A figured glass produced by a roll-out method is suitable as the glass sheet having the average spacing Sm falling in the above-mentioned range. The roll-out method has been conventionally used for producing a glass sheet, in order to produce a figured glass to be used mainly as window glass for buildings. In the roll-out method, a molten glass raw material is interposed between a pair of rollers to be formed into a plate. By roughening a surface of the rollers in advance, a shape corresponding to the roughness is transferred to a surface of the resultant glass sheet. A glass sheet having an uneven surface can be obtained also by roughening a glass sheet having a flat surface by etching. However, the surface roughened by etching has excessively small average spacing Sm, and thus the surface roughness produced by etching is not suitable for the present invention. The glass sheet may have the same composition as a common figured glass or sheet glass for buildings, but preferably the content of coloring components is reduced to a minimum. In the glass sheet, the content of iron oxide that is a typical coloring component is preferably 0.06 mass % or less, particularly 0.02 mass % or less, in terms of $Fe_2O_3$.

The uneven surface of the glass sheet preferably has not only an average spacing Sm in the above-mentioned range but also a maximum height Ry in the range of 0.5 μm to 10 μm, particularly 1 μm to 8 μm.

Also, the uneven surface of the glass sheet preferably has an arithmetic average roughness Ra in the range of 0.1 μm to 10 μm, particularly 0.5 μm to 5.0 μm, further 0.5 μm to 2.0 μm, especially 0.5 μm to 1.0 μm, in addition to the average spacing Sm in the above-mentioned range. The maximum height Ry and the arithmetic average roughness Ra are prescribed in JIS B0601-1994 together with the average spacing Sm. When the degree of roughness to be expressed by these indices is excessively low, the antiglare effect by the uneven surface cannot be obtained sufficiently. On the other hand, when the degree of roughness to be expressed by these indices is excessively high, color unevenness in the reflection color tone appears in a plane, or no film is formed on the top portion of the convex portion, resulting in an increase in reflectance.

The uneven surface of the glass sheet preferably has an average slope angle θ, given by $\theta = \tan^{-1}(4Ra/Sm)$, in the range of 0.05 to 1.0 degree, particularly 0.1 to 0.5 degree. As the average slope angle θ decreases, the roughness of the glass surface becomes shallower, and a sufficient thickness distribution is less likely to be formed when the film is formed. As a result, an appearance defect may occur. On the other hand, as the average slope angle θ increases, the roughness of the glass surface becomes steeper, and no film is formed on the top portion of the convex portion. In this case, there is a possibility that the glass sheet is exposed, and thus the reflectance tends to increase.

The reflection-reducing film contains silica fine particles, and these silica fine particles form a skeleton framework of the film. On the top portion of the uneven surface of the glass sheet, silica fine particles are arranged in a single layer (one layer), in other words, without stacking on each other. In contrast, on the bottom portion of the uneven surface, silica fine particles are arranged to have a thickness equivalent to at least three layers, preferably at least four layers. Due to the thickness distribution of the reflection-reducing film to be brought about by the difference in the number of stacked layers of silica fine particles, the reflectance curve of the cover glass in the visible region is flattened to fall within a limited range of 1.5 to 3% in the wavelength range of 380 to 780 nm, and further the difference between the maximum reflectance and the minimum reflectance in this wavelength range can be reduced to 1% or less.

When the average particle size of the silica fine particles is referred to as r, the reflection-reducing film is regarded to have a thickness equivalent to at least three layers of silica fine particles by having a film thickness of at least 3r on the bottom portion of the uneven surface. The number of stacked layers of silica fine particles and the film thickness can be determined by actually observing the cross section of the reflection-reducing film using a scanning electron microscope, etc.

The average particle size r of the silica fine particles is preferably 10 nm to 1000 nm, particularly 50 nm to 300 nm, especially 70 nm to 200 nm. When the average particle size r is either excessively small or excessively large, the reflectance in the visible region may fail to sufficiently decrease in some cases.

As the silica fine particles, solid (non-hollow) silica fine particles are preferably used, though hollow silica fine particles are commercially available, because the abrasion resistance should be considered to be important for application as the reflection-reducing film to be formed on a cover glass for photoelectric conversion devices.

The reflection-reducing film contains, together with silica fine particles, a binder for the silica fine particles. The binder is interposed between silica fine particles and the glass sheet, and between adjacent silica fine particles, serving to enhance the bond strength therebetween. As the binder, a metal oxide such as silicon, titanium, aluminium, zirconium, and tantalum is used preferably. Among these, silicon oxide (silica) is most preferable. Silicon oxide is excellent as a reinforcer because of its high affinity with silica fine particles and a glass sheet, and it does not inhibit the reflection-reducing effect by the reflection-reducing film because of its low refractive index. It should be noted that silicon is not generally classified as a metal in terms of element, but silicon oxide (compound) is considered herein as a kind of metal oxides (compounds) according to conventional usage.

As a supply source of the binder, a hydrolyzable metal compound represented by silicon alkoxide can be used. Examples of silicon alkoxide include tetramethoxysilane, tetraethoxysilane, and tetraisopropoxysilane. Such a hydrolyzable metal compound may be subjected to hydrolysis and condensation polymerization using the so-called sol-gel method so as to form an oxide binder.

Hydrolysis of the hydrolyzable metal compound is preferably carried out in a solution in which silica fine particles are present. This is because the condensation polymerization reaction between silanol group present on the surface of silica fine particles and silanol group produced through hydrolysis of a metal compound such as silicon alkoxide is accelerated and proportion of the binder that contributes to improvement in the bonding force of the silica fine particles is increased. Specifically, it is preferable to prepare a coating solution for the reflection-reducing film by sequentially adding a hydrolysis catalyst and silicon alkoxide to a solution containing silica fine particles under stirring.

The ratio of the silica fine particles and the binder in the reflection-reducing film is preferably set to 90:10 to 65:35, further 85:15 to 65:35, particularly 80:20 to 65:35, on a weight basis. When the ratio of the silica fine particles and the binder that form the reflection-reducing film falls within such a range, the binder contributes to maintaining the strength of the skeleton framework of silica fine particles as well as the apparent refractive index of the reflection-reducing film decreases due to voids formed in the skeleton framework of the silica fine particles, thereby enhancing the reflection reducing effect. When the ratio of the binder is excessively high, the voids between the silica fine particles are lost. In contrast, when the ratio of the binder is excessively low, the strength of the skeleton framework of the silica fine particles decreases.

Zirconium oxide (zirconia, $ZrO_2$) or titanium oxide (titania, $TiO_2$) that is a metal oxide is preferably further added to the reflection-reducing film, in addition to the silica fine particles and binder. The content of zirconium oxide and the content of titanium oxide in the reflection-reducing film each are preferably 5 wt % or less. The alkali resistance of the reflection-reducing film is improved by the addition of zirconium oxide or titanium oxide. In the cover glass produced by forming the reflection-reducing film on the figured glass, an absolute value of the difference in the visible-light transmission measured before and after the alkali resistance evaluation test to be mentioned later is preferably 1.5% or less. The content of the additive that is zirconium oxide and/or titanium oxide in the reflection-reducing film is preferably at least 0.5 wt %, further at least 1 wt %, particularly at least 1.5 wt %.

As a reflection-reducing film, a dielectric multilayer film (e.g., alternately stacked film of a high refractive index film made of titanium oxide, etc. and a low refractive index film made of silicon oxide, etc.) formed by a method such as sputtering and CVD, a low refractive index film (e.g., a magnesium fluoride film by vacuum vapor deposition) formed by vacuum vapor deposition also are known. However, it is exceptionally difficult to form such a reflection-reducing film in such a way as to have a small thickness on the top portion of the uneven surface while having, on the bottom portion, a large thickness at least three times the thickness on the top portion. In contrast, the above-mentioned thickness distribution can be achieved easily in a fine particle-containing film, as shown in Examples to be mentioned later.

The fine particle-containing film (reflection-reducing film) can be formed by supplying a coating solution containing silica fine particles and a compound that serves as a supply source of a binder onto the surface of a glass sheet, followed by drying and further heating. Although the coating solution can be supplied, for example, by immersing the glass sheet in the coating solution (dipping), a method of atomizing (spraying) the coating solution onto the glass sheet is excellent in production efficiency and thus is suitable for mass production.

Whereas the spray coating is suitable for mass production in view of production efficiency, it has a problem that the film thickness tends to be non-uniform when the spray coating is applied to mass production. Such non-uniformity is derived from the overlap of the coating solution sprayed from a spray gun in the form of a mist or the overlap of the distribution of the mist (spraying pattern), and emerges as color unevenness in the reflection color tone with a diameter of about several mm.

Although the color unevenness caused by spray coating can be recognized visually regardless of whether the surface of the glass sheet on which the reflection-reducing film is formed is smooth or uneven, the color unevenness is eliminated ultimately when the surface roughness falls within the range defined in the present invention.

That is, from another aspect, the present invention provides a method for producing a cover glass for photoelectric conversion devices. The cover glass further includes a glass sheet having an uneven surface and a reflection-reducing film formed on the uneven surface of the glass sheet. The reflection-reducing film includes silica fine particles and a binder for the silica fine particles. The silica fine particles are arranged in a single layer on the top portion of the uneven surface, while the silica fine particles are arranged in stacks to a thickness equivalent to at least three layers on the bottom portion of the uneven surface. The uneven surface has an average spacing Sm of at least 0.4 mm but not more than 2.5 mm and an arithmetic average roughness Ra of 0.5 μm to 5 μm The cover glass has a reflectance of at least 1.5% but not more than 3% over the entire wavelength range of 380 nm to 780 nm for incident light from the side on which the reflection-reducing film is formed. The method for producing the cover glass for photoelectric conversion devices includes the steps of spraying a coating solution containing the silica fine particles and a metal compound that serves as a supply source of the binder onto the uneven surface of the glass sheet; drying the coating solution sprayed onto the glass sheet; and heating the glass sheet so that the metal compound contained in the dried coating solution forms an oxide so as to serve as the binder.

In one embodiment of the above-mentioned production method, the coating solution is sprayed from above the glass sheet maintained in a horizontal position, using a spray gun maintained at a constant distance from the glass sheet.

In one embodiment of the above-mentioned production method, a surfactant is added to the coating solution. As the surfactant, a silicone surfactant or a fluorine surfactant is suitably used. Further, the concentration of the surfactant in the coating solution is preferably at least 0.005 wt % but not more than 0.5 wt %, particularly at least 0.01 wt % but not more than 0.1 wt %. A preferable reflection-reducing film is formed presumably because: the addition of the surfactant reduces the surface tension of the coating solution and the liquid film is concentrated when the coating solution supplied onto the surface of the glass sheet is dried, thereby promoting the aggregation of fine particles and allowing the deposition of the fine particles on the concave portion of the glass sheet.

EXAMPLES

Hereinafter, the present invention is described further in detail with reference to Examples. First, the details of the test conducted to evaluate the properties of the cover glass produced in each of Examples and Comparative Examples are described.

(Surface Shape Measurement of Figured Glass)

Using a noncontact three-dimensional shape measuring apparatus (NH-3N, manufactured by Mitaka Kohki Co., Ltd.), the arithmetic average roughness Ra, the maximum height Ry, and the average spacing Sm of the uneven surface of each figured glass used as a substrate were determined from an average of 10 measurement points, with an evaluation length of 5.0 mm and a cut-off wavelength of 2.5 mm, according to JIS B0601-1994. Further, the average slope angle θ was determined from the arithmetic average roughness Ra and the average spacing Sm.

(Reflection Properties)

The reflectance curves (reflection spectra) of the surface formed with the reflection-reducing film were obtained by measurement using a spectrophotometer (UV-3100, manufactured by SHIMADZU CORPORATION). According to JIS K5602, the measurement was carried out with incident light from the normal direction by introducing the direct reflection light at a reflection angle of 8° into an integrating sphere. The average reflectance was calculated by averaging the reflectance in the wavelength range of 400 nm to 1100 nm. In the measurement, black paint was applied to the back surface (unmeasured surface) of the glass sheet so as to eliminate reflection from the back surface, and correction was performed based on a standard specular reflector.

(Transmission Properties)

Using the above-mentioned spectrophotometer, the transmittance curves (transmission spectra) of the cover glass before and after the formation of the reflection-reducing film were obtained by measurement. The average transmittance was calculated by averaging the transmittance in the wavelength range of 400 to 1100 nm A value obtained by subtracting the average transmittance before the formation of the reflection-reducing film from the average transmittance after the formation of the reflection-reducing film was taken as a transmittance gain.

(Appearance Evaluation)

The appearance of the cover glass formed with the reflection-reducing film was evaluated by visual inspection according to the following criteria:

◉ : Uniformity and reflection color tone are almost equivalent to a figured glass formed without the reflection-reducing film;
○: Uniformity is good, although a specific reflection color is observed;
△: Reflection color tone differs depending on the location, and uniformity is slightly poor; and
×: Reflection color tone differs significantly depending on the location, and uniformity is poor.

(SEM Observation)

The cross sections of the convex portion and concave portion of the reflection-reducing film were observed from above at an angle of 30° using a Field Emission Scanning Electron Microscope (FE-SEM: S-4500, manufactured by Hitachi, Ltd.). Shooting conditions were set to an acceleration voltage of 10 kV and a 50,000-fold magnification.

(Alkali Resistance Evaluation)

The alkali resistance of the resultant reflection-reducing film was evaluated according to JIS R3221. The cover glass formed with the reflection-reducing film was immersed in a sodium hydroxide aqueous solution at a temperature of 23° C. and a concentration of 1 $kmol/m^3$ (1N) for 24 hours. The transmittance before and after the immersion was measured using a haze meter (NDH2000, manufactured by NIPPON DENSHOKU INDUSTRIES CO., LTD.), as well as the appearance change before and after the immersion was observed by visual inspection. The alkali resistance was evaluated from the absolute values of the respective differences. The alkali resistance was evaluated according to the following criteria:

◉ : No appearance change is observed;
○: The film remains on the entire surface, although a slight change is observed in the reflection color tone;
△: A significant change is observed in the reflection color tone; and
×: The film is separated.

Example 1

<Preparation of Coating Solution>

36.96 parts by weight of a silica fine particle dispersion (PL-7, manufactured by FUSO CHEMICAL CO., LTD, average particle size: 100 nm, solid content concentration: 23 wt %), 56.84 parts by weight of ethyl cellosolve, and 1.0 part by weight of 1N hydrochloric acid (hydrolysis catalyst) were mixed and stirred, to which 5.2 parts by weight of tetraethoxysilane was added under continuous stirring. Subsequently, it was stirred for 8 hours while being maintained at 40° C. Thus, an undiluted solution was obtained. In this undiluted solution, the solid content concentration was 10 wt % and the ratio of the fine particles and the binder (in terms of oxide) in the solid content was 85:15 on a weight basis. The above-mentioned silica fine particles were solid (in other words, non-hollow) fine particles.

13.0 parts by weight of the undiluted solution, 5.0 parts by weight of propylene glycol, 81.98 parts by weight of 2-propanol, and 0.02 part by weight of a silicone surfactant (CoatOSil1211, manufactured by Momentive Performance Materials Inc.) were mixed and stirred. Thus, a coating solution was obtained. In this coating solution, the solid content concentration was 1.3 wt % and the surfactant concentration was 0.02 wt %.

<Formation of Reflection-reducing Film>

A figured glass (100 mm×300 mm, thickness: 3.2 mm, manufactured by Nippon Sheet Glass Co., Ltd.) having a soda lime silicate composition was subjected to ultrasonic alkaline cleaning to be prepared as a substrate to be formed with a reflection-reducing film. The surface shape of this figured glass was as follows: the uneven surface had an arithmetic average roughness Ra of 0.76 µm, a maximum height Ry of 4.54 µm, an average spacing Sm of 1120 µm, and an average slope angle θ of 0.156 degree. This figured glass, as measured for reflection and transmission properties according to the above-mentioned methods, showed an average reflectance of 4.54% and an average transmittance of 91.68%.

The coating solution was applied onto the figured glass by spray coating. Spray coating was carried out by spraying the coating solution from above the figured glass maintained in a horizontal position, using a commercially available spray gun. In spraying, the spray gun was moved relative to the figured glass, while the spray gun was maintained at a constant distance from the figured glass. Subsequently, this figured glass was placed in an electrical furnace at 300° C. for 1 minute so that the solvent in the coating solution was removed, which further was placed in an electrical furnace at 610° C. for 8 minutes, thereby forming a reflection-reducing film by sintering. Thus, a cover glass was obtained. The resultant cover glass was evaluated for the above-mentioned properties. The evaluation results are shown in Table 1. Further, the observation results of the cross section of the produced reflection-reducing film using the FE-SEM are shown in FIG. 1 (top portion) and FIG. 2 (bottom portion).

Example 2

An undiluted solution was obtained in the same manner as in Example 1, except that the proportion of the respective raw materials employed for preparing the undiluted solution was changed as follows: 30.43 parts by weight of the silica fine particle dispersion, 58.17 parts by weight of ethyl cellosolve, 1.0 part by weight of concentrated hydrochloric acid, and 10.4 parts by weight of tetraethoxysilane. In this undiluted solution, the solid content concentration was 10 wt %, and the ratio of the fine particles and the binder (in terms of oxide) in the solid content was 70:30 on a weight basis.

Meanwhile, a coating solution was obtained in the same manner as in Example 1, except that the proportion of the respective raw materials employed for preparing the coating solution was changed as follows: 17.0 parts by weight of the undiluted solution, 5.0 parts by weight of propylene glycol, 77.95 parts by weight of 2-propanol, and 0.05 part by weight of a silicone surfactant. Note that, as the silicone surfactant, CoatOSil3505 available from Momentive Performance Materials Inc. was used. In this coating solution, the solid content concentration was 1.7 wt %, and the surfactant concentration was 0.05 wt %. Subsequently, a cover glass was obtained in the same manner as in Example 1. The resultant cover glass was evaluated for the above-mentioned properties. The evaluation results are shown in Table 1.

Examples 3 to 8

Using a figured glass having the surface shape shown in Table 1 and a coating solution prepared as shown in Table 1, a cover glass was obtained in the same manner as in Example 1. The resultant cover glass of each Example was evaluated for the above-mentioned properties. The evaluation results are shown in Table 1.

Examples 9 to 11

Using a figured glass having the surface shape shown in Table 2 and a coating solution prepared as shown in Table 2, a cover glass was obtained in the same manner as in Example 1. Note that, as the silicone surfactant used for the coating solution, a fluorine surfactant was used. Specifically, F444 available from DIC Corporation, FTERGENT 251 available from NEOS COMPANY LIMITED, and FTERGENT 215M available from NEOS COMPANY LIMITED were used in the respective Examples. The resultant cover glass of each Example was evaluated for the above-mentioned properties. The evaluation results are shown in Table 2.

Examples 12 and 13

Figure 3:
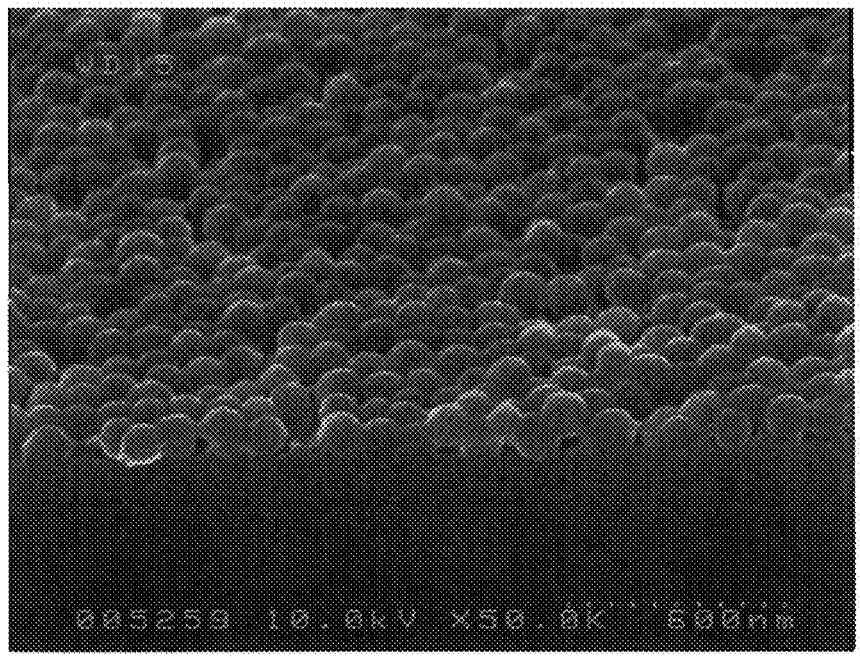
FIG. 3 is a view showing a result of observing a top portion of an uneven surface of a cover glass obtained in Example 12 using the FE-SEM.

Using a figured glass having the surface shape shown in Table 2 and a coating solution prepared as shown in Table 2, a cover glass was obtained in the same manner as in Example 1. $ZrO_2$ was added to the reflection-reducing film of each of Examples 12 and 13. As a starting material of $ZrO_2$, zirconium oxychloride octahydrate (special grade, available from KANTO CHEMICAL CO., INC.) was used. A coating solution was obtained by mixing and stirring the respective raw materials in the proportion shown in Table 3. An undiluted solution was prepared in the same manner as in Example 2. The ratio, in terms of oxide, of $SiO_2$ and $ZrO_2$ in the solid content was 100:3 on a weight basis in Example 12, and 100:5 on a weight basis in Example 13. The ratio of the fine particles and the binder (in terms of oxide) in the solid content was 70:30 on a weight basis in both Examples. The resultant cover glass of each Example was evaluated for the above-mentioned properties. The evaluation results are shown in Table 2. Further, the observation results, using the FE-SEM, of the cross section of the reflection-reducing film produced in Example 12 are shown in FIG. 3 (top portion) and FIG. 4 (bottom portion).

Examples 14 and 15

Using a figured glass having the surface shape shown in Table 2 and a coating solution prepared as shown in Table 2, a cover glass was obtained in the same manner as in Example 1. $TiO_2$ was added to the reflection-reducing film of each of Examples 14 and 15. As a starting material of $TiO_2$, ORGATIX TC-401 (titanium acetylacetonate, available from Matsumoto Trading Co., Ltd., solid content concentration: 65 wt %, 2-propanol solution) was used. A coating solution was obtained by mixing and stirring the respective raw materials in the proportion shown in Table 3. An undiluted solution was prepared in the same manner as in Example 2. The ratio, in terms of oxide, of $SiO_2$ and $TiO_2$ in the solid content was 100:3 on a weight basis in Example 14, and 100:5 on a weight basis in Example 15. The ratio of the fine particles and the binder (in terms of oxide) in the solid content was 70:30 on a weight basis in both Examples. The resultant cover glass of each Example was evaluated for the above-mentioned properties. The evaluation results are shown in Table 2.

Example 16

Figure 5:
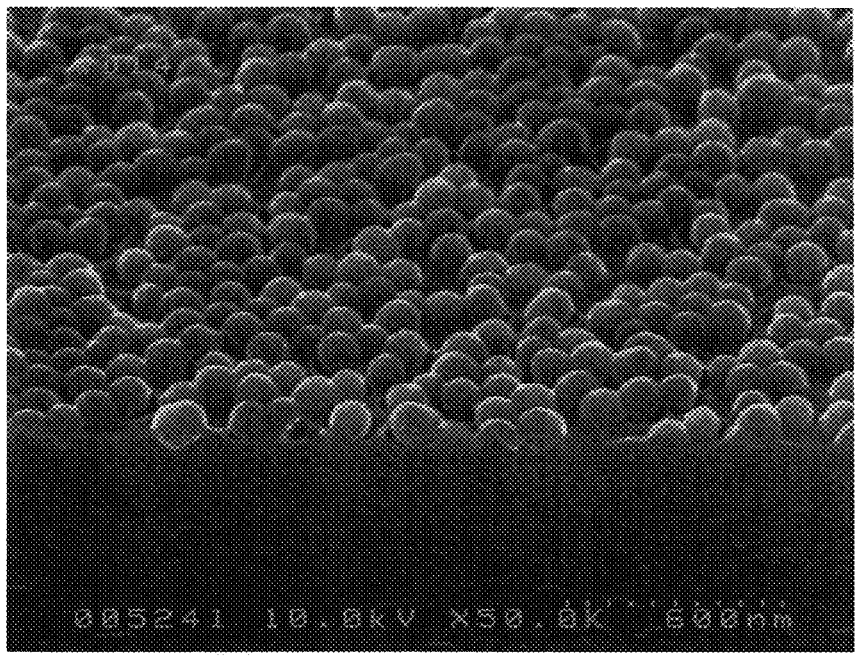
FIG. 5 is a view showing a result of observing a top portion of an uneven surface of a cover glass obtained in Example 16 using the FE-SEM.

Using a figured glass having the surface shape shown in Table 2 and a coating solution prepared as shown in Table 2, a cover glass was obtained in the same manner as in Example 1. A coating solution was obtained in the same manner as in Example 12 using the respective raw materials in the proportion shown in Table 3. As a surfactant, FTERGENT 251, which is a fluorine surfactant, was used. The resultant cover glass was evaluated for the above-mentioned properties. The evaluation results are shown in Table 2. Further, the observation results of the cross section of the produced reflection-reducing film using the FE-SEM are shown in FIG. 5 (top portion) and FIG. 6 (bottom portion).

Example 17

Using a figured glass having the surface shape shown in Table 2 and a coating solution prepared as shown in Table 2, a cover glass was obtained in the same manner as in Example 1. In Example 17, the ratio of the fine particles and the binder (in terms of oxide) in the solid content of the undiluted solution was 95:5 on a weight basis, the solid content concentration in the coating solution was 1.3 wt %, and the surfactant concentration in the coating solution was 0.02 wt %. The resultant cover glass was evaluated for the above-mentioned properties. The evaluation results are shown in Table 2.

Comparative Example 1

Figure 7:
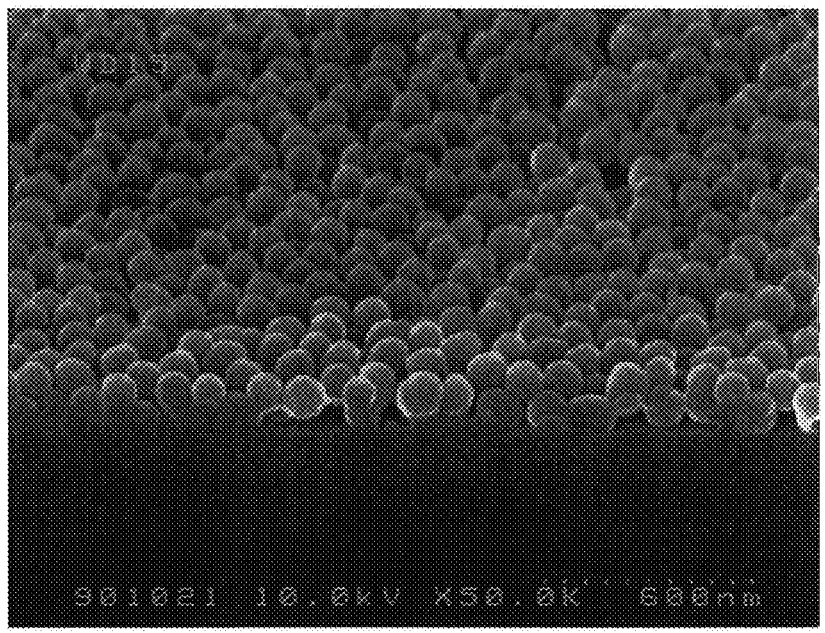
FIG. 7 is a view showing a result of observing a top portion of an uneven surface of a cover glass obtained in Comparative Example 1 using the FE-SEM.

An undiluted solution was prepared in the same manner as in Example 1, and a coating solution was obtained in the same manner as in Example 1, except that the proportion of the respective raw materials employed for preparing the coating solution was changed as follows: 13.0 parts by weight of the undiluted solution, 5.0 parts by weight of propylene glycol, and 82.0 parts by weight of 2-propanol. Note that no surfactant was added thereto. The solid content concentration in this coating solution was 1.3 wt %. Subsequently, a cover glass was obtained in the same manner as in Example 1. The resultant cover glass was evaluated for the above-mentioned properties. The evaluation results are shown in Table 4. Further, the observation results of the cross section of the produced reflection-reducing film using the FE-SEM are shown in FIG. 7 (top portion) and FIG. 8 (bottom portion).

Comparative Example 2

An undiluted solution was prepared in the same manner as in Example 2, and a coating solution was obtained in the same manner as in Example 1, except that the proportion of the respective raw materials employed for preparing the coating solution was changed as follows: 17.0 parts by weight of the undiluted solution, 5.0 parts by weight of propylene glycol, and 78.0 parts by weight of 2-propanol. Note that no surfactant was added thereto. The solid content concentration in this coating solution was 1.7 wt %. Subsequently, a cover glass was obtained in the same manner as in Example 1. The resultant cover glass was evaluated for the above-mentioned properties. The evaluation results are shown in Table 4.

Comparative Examples 3 to 6

Using a figured glass having the surface shape shown in Table 4 and a coating solution prepared as shown in Table 4, a cover glass was obtained in the same manner as in Example 1. The resultant cover glass of each of Comparative Examples was evaluated for the above-mentioned properties. The evaluation results are shown in Table 4.

Comparative Examples 7 to 9

Using a figured glass having the surface shape shown in Table 4 and a coating solution prepared as shown in Table 4, a cover glass was obtained in the same manner as in Example 1. Note that SN-Wet L, which is a fatty acid ester surfactant available from SAN NOPCO LIMITED, SN-Wet 970, which is a sulfonic acid surfactant available from SAN NOPCO LIMITED, and Tween 80, which is a sorbitan mono-oleate surfactant available from Sigma-Aldrich Corporation, were used in the respective Comparative Examples as a surfactant for the coating solution. The resultant cover glass of each of Comparative Examples was evaluated for the above-mentioned properties. The evaluation results are shown in Table 4.

TABLE 1

| | Ex. 1 | Ex. 2 | Ex. 3 | Ex. 4 | Ex. 5 | Ex. 6 | Ex. 7 | Ex. 8 |
|---|---|---|---|---|---|---|---|---|
| Content of fine particles (wt %) | 85 | 70 | 70 | 70 | 70 | 70 | 80 | 65 |
| Content of $SiO_2$ binder (wt %) | 15 | 30 | 30 | 30 | 30 | 30 | 20 | 35 |
| Content of additive (in terms of oxide) (wt %) | 0 | 0 | 0 | 0 | 0 | 0 | 0 | 0 |
| Content of surfactant in coating solution (wt %) | CoatOSil 1211 0.02 | CoatOSil 3505 0.05 | CoatOSil 3505 0.05 | CoatOSil 3505 0.05 | CoatOSil 3505 0.05 | CoatOSil 3505 0.05 | CoatOSil 1211 0.02 | CoatOSil 3505 0.05 |
| Solid content concentration in coating solution (wt %) | 1.3 | 1.7 | 1.7 | 1.7 | 1.7 | 1.7 | 1.3 | 1.7 |
| Figured substrate Sm (μm) | 1120 | 1120 | 510 | 2100 | 1100 | 1150 | 1120 | 1120 |
| Figured substrate Ra (μm) | 0.76 | 0.76 | 0.95 | 0.96 | 0.51 | 2.1 | 0.76 | 0.76 |
| Average slope angle θ (degree) | 0.156 | 0.156 | 0.427 | 0.105 | 0.106 | 0.419 | 0.156 | 0.156 |
| Appearance evaluation | ○ | ◉ | ◉ | ◉ | ◉ | ◉ | ○ | ◉ |
| Transmittance gain (%) | 1.84% | 1.62% | 1.60% | 1.61% | 1.62% | 1.60% | 1.76% | 1.54% |
| Average reflectance (%) | 2.14% | 2.97% | 2.98% | 2.97% | 2.96% | 2.98% | 2.36% | 2.79% |
| Maximum reflectance in the wavelength range of 380 to 780 nm (%) | 2.63% | 2.94% | 2.97% | 2.93% | 2.92% | 2.96% | 2.64% | 2.74% |

TABLE 1-continued

|  | Ex. 1 | Ex. 2 | Ex. 3 | Ex. 4 | Ex. 5 | Ex. 6 | Ex. 7 | Ex. 8 |
|---|---|---|---|---|---|---|---|---|
| Minimum reflectance in the wavelength range of 380 to 780 nm (%) | 1.75% | 2.58% | 2.60% | 2.59% | 2.59% | 2.60% | 2.05% | 2.35% |
| Alkali resistance evaluation | 1.20% X | 0.89% Δ | — | — | — | — | 1.08% Δ | 0.80% Δ |

TABLE 2

|  | Ex. 9 | Ex. 10 | Ex. 11 | Ex. 12 | Ex. 13 | Ex. 14 | Ex. 15 | Ex. 16 | Ex. 17 |
|---|---|---|---|---|---|---|---|---|---|
| Content of fine particles (wt %) | 70 | 70 | 70 | 68.0 | 66.6 | 68.0 | 66.6 | 68.0 | 95 |
| Content of $SiO_2$ binder (wt %) | 30 | 30 | 30 | 29.1 | 28.6 | 29.1 | 28.6 | 29.1 | 5 |
| Content of additive (in terms of oxide) | — | — | — | $ZrCl_2O$ | $ZrCl_2O$ | TC-401 | TC-401 | $ZrCl_2O$ | — |
| (wt %) | 0 | 0 | 0 | 2.9 | 4.8 | 2.9 | 4.8 | 2.9 | 0 |
| Content of surfactant in coating solution (wt %) | F444 0.03 | Ftergent 251 0.03 | Ftergent 215M 0.03 | CoatOSil 3505 0.05 | CoatOSil 3505 0.05 | CoatOSil 3505 0.05 | CoatOSil 3505 0.05 | Ftergent 251 0.03 | CoatOSil 1211 0.02 |
| Solid content concentration in coating solution (wt %) | 1.7 | 1.7 | 1.7 | 1.5 | 1.5 | 1.5 | 1.5 | 1.5 | 1.3 |
| Figured substrate Sm (μm) | 1120 | 1120 | 1120 | 1120 | 1120 | 1120 | 1120 | 1120 | 1120 |
| Figured substrate Ra (μm) | 0.76 | 0.76 | 0.76 | 0.76 | 0.76 | 0.76 | 0.76 | 0.76 | 0.76 |
| Average slope angle θ (degree) | 0.156 | 0.156 | 0.156 | 0.156 | 0.156 | 0.156 | 0.156 | 0.156 | 0.156 |
| Appearance evaluation | ◉ | ◉ | ◉ | ○ | ○ | ○ | ○ | ◉ | ○ |
| Transmittance gain (%) | 1.61% | 1.55% | 1.55% | 1.62% | 1.60% | 1.62% | 1.61% | 1.58% | 2.04% |
| Average reflectance (%) | 2.97% | 3.00% | 3.00% | 2.96% | 2.97% | 2.84% | 2.92% | 2.99% | 1.94% |
| Maximum reflectance in the wavelength range of 380 to 780 nm (%) | 2.93% | 2.95% | 2.95% | 2.95% | 2.99% | 2.85% | 2.99% | 2.97% | 2.63% |
| Minimum reflectance in the wavelength range of 380 to 780 nm (%) | 2.59% | 2.65% | 2.66% | 2.67% | 2.74% | 2.40% | 2.32% | 2.69% | 1.75% |
| Alkali resistance evaluation | — | — | — | 0.55% ○ | 0.10% ◉ | 0.64% ○ | 0.22% ◉ | 0.53% ○ | 1.65% X |

TABLE 3

|  | Ex. 12 | Ex. 13 | Ex. 14 | Ex. 15 | Ex. 16 |
|---|---|---|---|---|---|
| Undiluted solution (parts by weight) | 14.56 | 14.29 | 14.56 | 14.29 | 14.29 |
| Propylene glycol (parts by weight) | 5 | 5 | 5 | 5 | 5 |
| 2-propanol (parts by weight) | 79.71 | 79.84 | 79.57 | 79.6 | 79.8 |
| $ZrCl_2O \cdot 8H_2O$ (50% aqueous solution) (parts by weight) | 0.23 | 0.37 | — | — | 0.61 |
| TC-401 (parts by weight) | — | — | 0.37 | 0.61 | — |
| CoatOSil 3505 (10% aqueous solution) (parts by weight) | 0.5 | 0.5 | 0.5 | 0.5 | — |
| Ftergent 251 (10% aqueous solution) (parts by weight) | — | — | — | — | 0.3 |
| Sum (parts by weight) | 100 | 100 | 100 | 100 | 100 |

TABLE 4

|  | C. Ex. 1 | C. Ex. 2 | C. Ex. 3 | C. Ex. 4 | C. Ex. 5 | C. Ex. 6 | C. Ex. 7 | C. Ex. 8 | C. Ex. 9 |
|---|---|---|---|---|---|---|---|---|---|
| Content of fine particles (wt %) | 85 | 70 | 70 | 70 | 70 | 70 | 70 | 70 | 70 |
| Content of $SiO_2$ binder (wt %) | 15 | 30 | 30 | 30 | 30 | 30 | 30 | 30 | 30 |
| Content of additive (in terms of oxide) (wt %) | — 0 | — 0 | — 0 | — 0 | — 0 | — 0 | — 0 | — 0 | — 0 |
| Content of surfactant in coating solution (wt %) | — 0 | — 0 | CoatOSil 3505 0.05 | CoatOSil 3505 0.05 | CoatOSil 3505 0.05 | CoatOSil 3505 0.05 | SN-Wet L 0.05 | SN-Wet 970 0.05 | Tween 80 0.05 |
| Solid content concentration in coating solution (wt %) | 1.3 | 1.7 | 1.7 | 1.7 | 1.7 | 1.7 | 1.7 | 1.7 | 1.7 |
| Figured substrate Sm (μm) | 1120 | 1120 | 350 | 3920 | 1130 | 1120 | 1120 | 1120 | 1120 |
| Figured substrate Ra (μm) | 0.76 | 0.76 | 0.96 | 0.94 | 0.3 | 5.4 | 0.76 | 0.76 | 0.76 |
| Average slope angle θ (degree) | 0.156 | 0.156 | 0.629 | 0.055 | 0.061 | 1.105 | 0.156 | 0.156 | 0.156 |
| Appearance evaluation | X | Δ | ◉ | Δ | Δ | ○ | Δ | X | Δ |
| Transmittance gain (%) | 2.27% | 1.77% | 1.40% | 1.61% | 1.61% | 1.45% | 1.70% | 1.69% | 1.68% |
| Average reflectance (%) | 1.96% | 2.85% | 3.47% | 2.97% | 2.97% | 3.03% | 2.99% | 3.00% | 3.01% |
| Maximum reflectance in the wavelength range of 380 to 780 nm (%) | 4.52% | 3.21% | 3.44% | 3.06% | 3.10% | 3.09% | 3.05% | 3.04% | 3.03% |
| Minimum reflectance in the wavelength range of 380 to 780 nm (%) | 1.13% | 2.59% | 3.08% | 2.59% | 2.59% | 2.47% | 2.48% | 2.43% | 2.38% |
| Alkali resistance evaluation | — | — | — | — | — | — | — | — | — |

Figure 2:
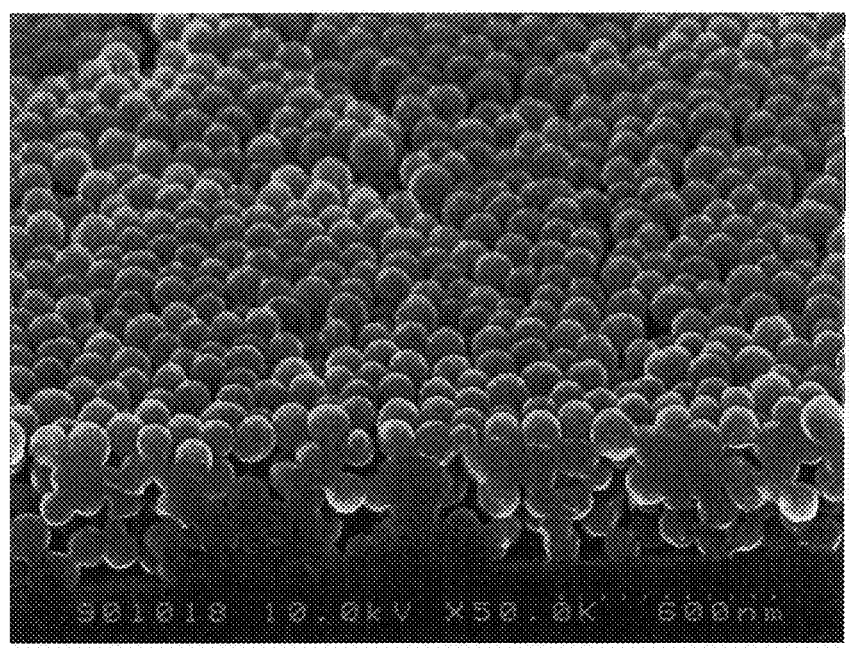
FIG. 2 is a view showing a result of observing a bottom portion of the uneven surface of the cover glass obtained in Example 1 using the FE-SEM.
Figure 4:
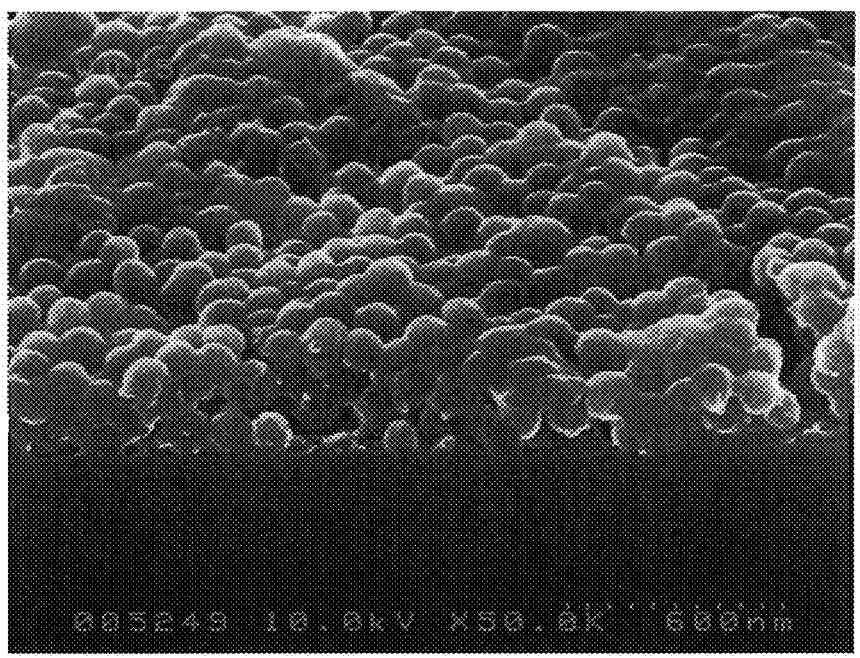
FIG. 4 is a view showing a result of observing a bottom portion of the uneven surface of the cover glass obtained in Example 12 using the FE-SEM.
Figure 6:
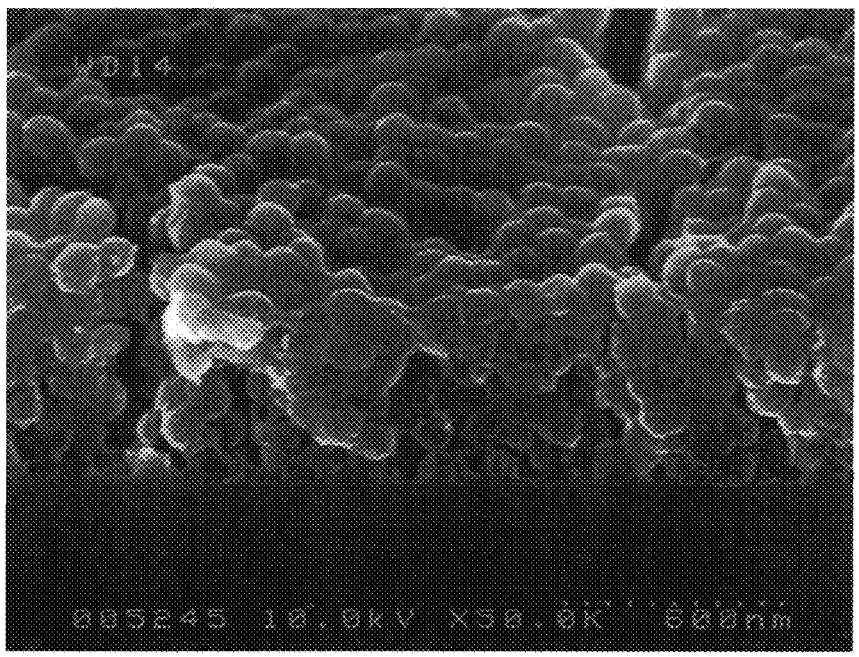
FIG. 6 is a view showing a result of observing a bottom portion of the uneven surface of the cover glass obtained in Example 16 using the FE-SEM.

As seen from FIG. 1 to FIG. 6, the reflection-reducing film has a skeleton framework composed of silica fine particles arranged in a single layer on the top portion of the uneven surface of the figured glass (FIGS. 1, 3, and 5). On the other hand, the reflection-reducing film has a skeleton framework composed of stacks of silica fine particles in about three to six layers on the bottom portion of the uneven surface of the figured glass (FIGS. 2, 4, and 6). As a result of observation using the FE-SEM, it was confirmed that, on the slope portion between the top portion and the bottom portion of the uneven surface of the figured glass, the closer the reflection-reducing film was to the top portion, the number of stacked layers decreased, while the closer it was to the bottom portion, the number of stacked layers increased. In this way, the thickness of the reflection-reducing film was continuously varied along the surface roughness of the figured glass. The reflection-reducing film produced in Example 2 was observed in the same manner, and it was found that the silica fine particles were arranged in a single layer on the top portion, while the silica fine particles were arranged in stacks of about four to five layers on the bottom portion, similarly to the reflection-reducing film produced in Example 1.

Figure 8:
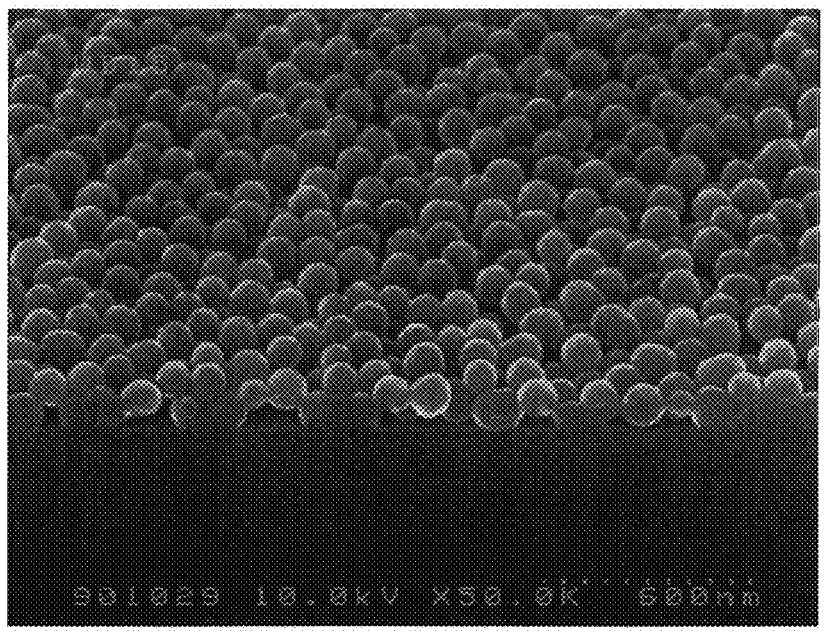
FIG. 8 is a view showing a result of observing a bottom portion of the uneven surface of the cover glass obtained in Comparative Example 1 using the FE-SEM.

According to FIGS. 7 and 8, the reflection-reducing film has a skeleton framework composed of silica fine particles arranged in one or two layers on the top portion and the bottom portion of the uneven surface of the figured glass. On the top portion and the bottom portion of the uneven surface, the thickness of the reflection-reducing film is almost constant. The reflection-reducing film produced in Comparative Example 2 also had a film structure similar to that of the reflection-reducing film produced in Comparative Example 1.

Figure 9:
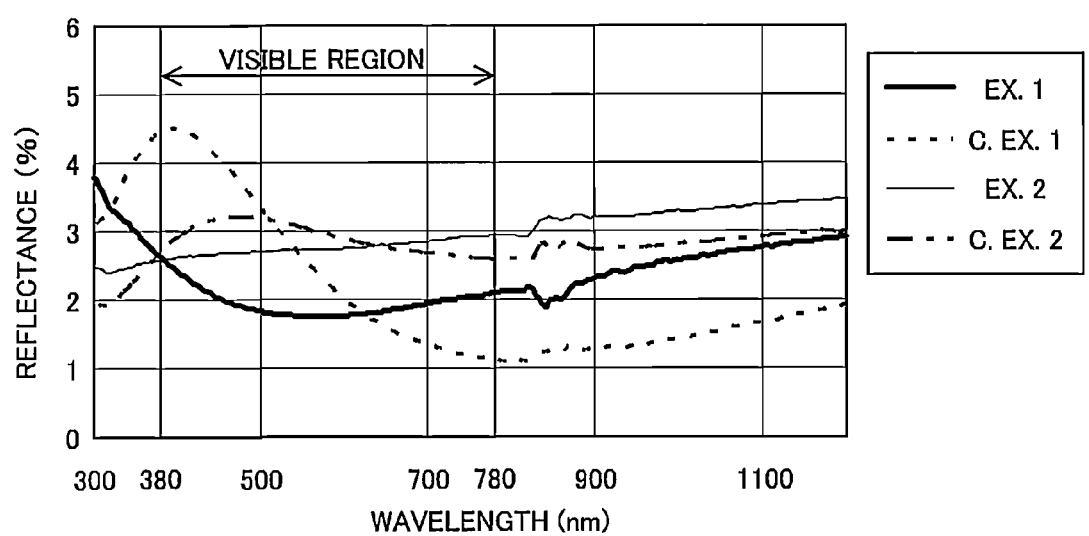
FIG. 9 shows reflection spectra of the cover glasses obtained in Examples 1 and 2, and Comparative Examples 1 and 2.

FIG. 9 shows the reflectance curves (reflection spectra) of the cover glasses produced in Examples 1 and 2, and Comparative Examples 1 and 2. The cover glasses of Examples 1 and 2 each yielded a reflectance curve having a reflectance within the range of 1.5 to 3% (within the range of 2.5 to 3% in Example 2; in both Examples 1 and 2, the difference between the maximum reflectance and the minimum reflectance in the wavelength range of 380 nm to 780 nm was 1% or less) in the wavelength range of 380 nm to 780 nm. On the other hand, the reflectance curve of the cover glass of Comparative Example 1 had a large peak at a wavelength of around 400 nm. Meanwhile, the reflectance curve of the cover glass of Comparative Example 2 had a small peak at a wavelength of around 400 nm to 500 nm and was not sufficiently flat, though it was flatter than that in Comparative Example 1. The highest reflectance of the cover glass of Comparative Example 2 exceeded 3%.

The reason why the reflectance curve in Example 2 was still flatter than the reflectance curve in Example 1 is presumably because the ratio of the fine particles with respect to the binder was reduced.

The appearance of the cover glass produced in Comparative Example 3 was evaluated as ◉, and the appearance of the cover glass produced in Comparative Example 6 was evaluated as ○. However, they had an excessively high average reflectance, and thus were not practical. It is presumed that a preferable reflection-reducing film was not formed on the cover glass produced in each of Comparative Examples 7 to 9, because neither a silicone surfactant nor a fluorine surfactant was used therein.

In contrast, from the fact that the maximum reflectance was 3% and the minimum reflectance was 1.5% in all the cover glasses produced in Examples with incident light in the wavelength range of 380 nm to 780 nm, it can be said that a preferable reflection-reducing film was formed on all the cover glasses of Examples. Further, it can be said that reflection light was sufficiently reduced, since the average reflectance was 3% or less, in all the cover glasses of Examples. The observation results, using the FE-SEM, of the top portion and the bottom portion of the uneven surface of all the cover glasses of Examples demonstrated that the silica fine particles were arranged in a single layer on the top portion, while the silica fine particles were arranged in stacks to a thickness equivalent to at least three layers on the bottom portion.

The cover glass of each of Examples 12 to 16 showed an alkali resistance improved by the addition of $ZrO_2$ or $TiO_2$ to the reflection-reducing film.

INDUSTRIAL APPLICABILITY

The present invention can provide a cover glass for photoelectric conversion devices that has improved appearance.

The invention claimed is:

1. A cover glass for photoelectric conversion devices comprising:
   a glass sheet having an uneven surface,
   wherein the cover glass further comprises a reflection-reducing film formed on the uneven surface of the glass sheet,
   the reflection-reducing film comprises silica fine particles and a binder for the silica fine particles,
   the silica fine particles are arranged in a single layer on a top portion of the uneven surface, while the silica fine particles are arranged in stacks to a thickness equivalent to at least three layers on a bottom portion of the uneven surface,
   the uneven surface of the glass sheet has an average spacing Sm of at least 0.4 mm but not more than 2.5 mm and an arithmetic average roughness Ra from 0.5 μm to 5 μm, and
   the cover glass has a reflectance of at least 1.5% but not more than 3% over the entire wavelength range from 380 nm to 780 nm for incident light from a side on which the reflection-reducing film is formed.

2. The cover glass for photoelectric conversion devices according to claim 1,
   wherein the uneven surface of the glass sheet has a maximum height Ry from 0.5 μm to 10 μm.

3. The cover glass for photoelectric conversion devices according to claim 1,
   wherein the uneven surface of the glass sheet has an arithmetic average roughness Ra from 0.5 μm to 1.0 μm.

4. The cover glass for photoelectric conversion devices according to claim 1,
   wherein the uneven surface of the glass sheet has an average spacing Sm of at least 0.5 mm but not more than 1.5 mm.

5. The cover glass for photoelectric conversion devices according to claim 1,
   wherein the uneven surface of the glass sheet has an average slope angle θ from 0.05 to 1.0 degree.

6. The cover glass for photoelectric conversion devices according to claim 5,
   wherein the uneven surface of the glass sheet has an average slope angle θ from 0.1 to 0.5 degree.

7. The cover glass for photoelectric conversion devices according to claim 1,
   wherein the glass sheet is a figured glass produced by a roll-out method.

8. The cover glass for photoelectric conversion devices according to claim 1,
   wherein a ratio of the silica fine particles relative to the binder is from 90:10 to 65:35 on a weight basis.

9. The cover glass for photoelectric conversion devices according to claim 8,
   wherein the ratio of the silica fine particles relative to the binder is from 85:15 to 65:35 on the weight basis.

10. The cover glass for photoelectric conversion devices according to claim 9,
    wherein the ratio of the silica fine particles relative to the binder is from 80:20 to 65:35 on the weight basis.

11. The cover glass for photoelectric conversion devices according to claim 1,
    wherein the binder is made of silica.

12. The cover glass for photoelectric conversion devices according to claim 1,
    wherein the reflection-reducing film further contains zirconia in a content of 5 wt % or less.

13. The cover glass for photoelectric conversion devices according to claim 1,
    wherein the reflection-reducing film further contains titania in a content of 5 wt % or less.

14. A method for producing a cover glass for photoelectric conversion devices according to claim 1, which comprises a glass sheet having an uneven surface, the method comprising steps of:
    spraying a coating solution containing the silica fine particles and a metal compound that serves as a supply source of the binder, onto the uneven surface of the glass sheet;
    drying the coating solution sprayed onto the glass sheet; and
    heating the glass sheet thereby the metal compound contained in the dried coating solution forming an oxide so as to serve as the binder.

* * * * *